(12) United States Patent
Tuominen et al.

(10) Patent No.: US 11,284,508 B2
(45) Date of Patent: Mar. 22, 2022

(54) SEMI-FLEX COMPONENT CARRIER WITH DIELECTRIC MATERIAL HAVING HIGH ELONGATION AND LOW YOUNG MODULUS

(71) Applicant: AT&S Austria Technologie & Systemtechnik Aktiengesellschaft, Leoben (AT)

(72) Inventors: Mikael Tuominen, Pernio (FI); Nick Xin, Shanghai (CN); Seok Kim Tay, Singapore (SG)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 16/947,417

(22) Filed: Jul. 31, 2020

(65) Prior Publication Data

US 2021/0045235 A1 Feb. 11, 2021

(30) Foreign Application Priority Data

Aug. 6, 2019 (CN) .......................... 201910721769.5

(51) Int. Cl.
| H05K 1/02 | (2006.01) |
| H05K 1/18 | (2006.01) |
| H05K 3/46 | (2006.01) |

(52) U.S. Cl.
CPC .......... H05K 1/0278 (2013.01); H05K 1/183 (2013.01); H05K 1/185 (2013.01); H05K 1/189 (2013.01); H05K 3/4655 (2013.01)

(58) Field of Classification Search
CPC ...... H05K 1/0278; H05K 1/183; H05K 1/185; H05K 1/189; H05K 3/4655

USPC .......................................................... 361/750
See application file for complete search history.

(56) References Cited

U.S. PATENT DOCUMENTS

| 2004/0152803 A1 | 8/2004 | Ahsan |
| 2005/0048291 A1 | 3/2005 | Woo et al. |
| 2011/0120754 A1 | 5/2011 | Kondo et al. |
| 2014/0071639 A1 | 3/2014 | Honjo et al. |
| 2016/0264717 A1* | 9/2016 | Pastine .............. C08G 59/1477 |

(Continued)

FOREIGN PATENT DOCUMENTS

| CN | 101069458 A | 11/2007 |
| CN | 101365298 A | 2/2009 |

(Continued)

OTHER PUBLICATIONS

Machine Translation of Ito (Japanese Patent Publication No. 2009-111033A), May 21, 2009 (Year: 2009).*

(Continued)

Primary Examiner — Tremesha S Willis
(74) Attorney, Agent, or Firm — Robert A. Blaha; Smith Tempel Blaha LLC

(57) ABSTRACT

A semi-flex component carrier includes a stack having at least one electrically insulating layer structure and/or at least one electrically conductive layer structure. The stack defines at least one rigid portion and at least one semi-flexible portion. The at least one electrically insulating layer structure forms at least part of the semi-flexible portion and includes a material having an elongation of larger than 3% and a Young modulus of less than 5 GPa.

29 Claims, 3 Drawing Sheets

(56) References Cited

U.S. PATENT DOCUMENTS

2016/0336247 A1   11/2016  Yu et al.
2017/0275453 A1    9/2017  Nakamata et al.
2021/0045235 A1    2/2021  Tuominen et al.

FOREIGN PATENT DOCUMENTS

| | | |
|---|---|---|
| CN | 202503812 U | 10/2012 |
| CN | 205093052 U | 3/2016 |
| CN | 109757025 A | 5/2019 |
| CN | 112351571 A | 2/2021 |
| JP | 2009111033 A | 5/2009 |
| WO | 2017154570 A1 | 9/2017 |

OTHER PUBLICATIONS

Corrosionpedia—What is a Percent Elongation?; available at https://www.corrosionpedia.com/definition/6342/percent-elongation; as downloaded on Jul. 31, 2020; 2 pp.; last updated Dec. 31, 2018; Corrosionpedia Inc.

English translation of Notification of First Office Action in Application No. 201910721769.5; pp. 1-3; dated Jul. 1, 2021; The China National Intellectual Property Administration; No. 6, Xitucheng Lu, Jimenqiao Haidian District, Beijing City, 100088, China.

Notification of First Office Action in Application No. 201910721769.5; pp. 1-13; dated Jul. 1, 2021; The China National Intellectual Property Administration; No. 6, Xitucheng Lu, Jimenqiao Haidian District, Beijing City, 100088, China.

\* cited by examiner

SEMI-FLEX COMPONENT CARRIER WITH DIELECTRIC MATERIAL HAVING HIGH ELONGATION AND LOW YOUNG MODULUS

CROSS-REFERENCE TO RELATED APPLICATIONS

The present application claims priority to China Patent Application No. 201910721769.5 filed Aug. 6, 2019, the entire contents of which is incorporated herein by reference in its entirety.

TECHNICAL FIELD

The invention relates to a semi-flex component carrier and a method of manufacturing a semi-flex component carrier.

TECHNOLOGICAL BACKGROUND

In the context of growing product functionalities of component carriers equipped with one or more electronic components and increasing miniaturization of such components as well as a rising number of components to be mounted on the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Different types of partially flexible and partially rigid component carriers exist. A "rigid-flex component carrier" comprises a fully flexible portion, for instance made of polyimide, being a different material than stiffer dielectric material of a rigid portion. However, implementing fully flexible materials such as polyimide in a component carrier is cumbersome and involves reliability issues.

Another conventional type of partially flexible and partially rigid component carriers is a "semi-flex component carrier" which is a component carrier in which its semi-flexible portion may comprise the same dielectric (for instance FR4) material as a rigid portion, so that bendability of the semi-flexible portion only results from the reduced thickness in the semi-flexible region. However, conventional semi-flex component carriers are prone to breakage upon bending a semi-flexible portion thereof.

SUMMARY

There may be a need to provide a partially rigid and partially flexible component carrier with high reliability.

According to an exemplary embodiment of the invention, a semi-flex component carrier is provided which comprises a stack (in particular a laminated stack, i.e. a stack in which its layer structures are connected by the application of heat and/or pressure) comprising at least one electrically insulating layer structure and/or at least one electrically conductive layer structure, wherein the stack defines at least one rigid portion and at least one semi-flexible portion, wherein at least one of the at least one electrically insulating layer structure forming at least part of the semi-flexible portion comprises a material having an elongation of larger than 3% (in particular at a temperature of 300 K) and a Young modulus of less than 5 GPa (in particular at a temperature of 300 K).

According to another exemplary embodiment of the invention, a method of manufacturing a semi-flex component carrier is provided, wherein the method comprises providing (in particular laminating, i.e. connecting by the application of heat and/or pressure) a stack comprising at least one electrically insulating layer structure and/or at least one electrically conductive layer structure, wherein the stack defines at least one rigid portion and at least one semi-flexible portion, and forming at least one of the at least one electrically insulating layer structure forming at least part of the semi-flexible portion from a material having an elongation of larger than 3% (in particular at a temperature of 300 K) and a Young modulus of less than 5 GPa (in particular at a temperature of 300 K).

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "rigid portion" may particularly denote a portion of the component carrier which, when applying or exerting ordinary forces typically occurring during operation of the component carrier, the rigid portion will remain substantially undeformed. In other words, the shape of the rigid portion will not be changed when applying forces during operation of the component carrier.

In the context of the present application, the term "semi-flexible portion" may particularly denote a portion of the component carrier which, upon exerting typical forces occurring during operation of the component carrier, may result in a deformation of the semi-flexible portion. The deformation of the semi-flexible portion may be possible to such an extent that the shape of the entire component carrier may be significantly influenced by deforming the semi-flexible portion. However, such a semi-flexible portion may be less flexible than a fully flexible portion (formed, for instance, from polyimide). Bending of the semi-flexible portion without breakage may be possible only once, only a limited number of bending cycles, or may be even possible without damage for an infinite number of bending cycles.

In the context of the present application, the term "semi-flex component carrier with semi-flexible portion" may particularly denote a component carrier in which its semi-flexible portion may be made, partially or entirely, of the same dielectric and/or metallic material as one or more adjacent rigid portions, but may for instance only have a locally smaller thickness than the connected rigid portion(s). In such a configuration, bendability of the semi-flexible portion only results from the reduced thickness rather than from a more flexible material in the flexible portion. In contrast to such a semi-flex component carrier, a rigid-flex component carrier (i.e. another type of partially flexible and partially rigid component carrier) comprises a fully flexible portion, for instance made of polyimide (for example having an elongation of about 70%). In such an embodiment, the material of the flexible portion may be different from the material of one or two adjacent rigid portions, and the material of the flexible portion may be specifically selected to have high elasticity or flexibility.

In the context of the present application, the term "Young modulus" may particularly denote the elastic modulus, i.e. a measure of the stiffness of a solid material and defines the relationship between stress (force per unit area) and strain (proportional deformation) in a material. A softer material has a smaller value of the Young modulus than a more rigid material.

In the context of the present application, the term "elongation", "percent elongation" or "percentage elongation" may particularly denote a remaining elongation of a body after breakage in relation to its initial length. Percent elongation may be a measurement that captures the amount a material will plastically and/or elastically deform up to fracture. Percent elongation is one way to measure and quantify ductility of a material. The material's final length may be compared with its original length to determine the percent elongation and the material's ductility. To calculate percent elongation, the original length of a gauge span may be subtracted from the final length. Then the result from that subtraction may be divided by the original length and multiplied by 100 to obtain the percent elongation. The equation is: elongation=100×[(final length−initial length)/initial length]. Elongation is hence indicative of the ductility of a material. A material with a higher elongation is a more ductile material, while a material with a lower percentage will be more brittle. For instance, FR4 may have an elongation of about 1-2%.

According to an exemplary embodiment of the invention, a semi-flex component carrier is provided which comprises a dielectric material at least in a semi-flexible portion thereof and having a combination of a Young modulus (i.e. a ratio between an expanding force and a spatial expansion) of less than 5 GPa and an elongation (i.e. a relative length expansion at a point of failure) of more than 3%. Descriptively speaking, such a dielectric material in a semi-flexible portion of a semi-flex component carrier has a higher elasticity and is more ductile than conventional FR4 material. As a result, the semi-flex component carrier may be less prone to failure (in particular less prone to the formation of cracks or to breakage) when the semi-flexible portion is bent.

Thus, an exemplary embodiment of the invention applies a low modulus material with high elongation or ultimate strain on a semi-flex component carrier such as a semi-flex printed circuit board (PCB). As a result, it may be advantageously possible to realize a semi-flex component carrier with a small bending radius and/or an increased number (for instance at least two or at least three) of flexible layers in a semi-flexible portion of the component carrier. Thus, exemplary embodiments of the invention may make it possible to solve issues with conventional semi-flex applications. In contrast to conventional approaches, in which standard PCB materials are applied on the bend area of a semi-flex component carrier for the usage of standard HDI (high density interconnect) and/or mSAP (modified semi-additive processing) PCB (printed circuit board) design rules to avoid limitations with polyimide rigid-flex technology, exemplary embodiments of the invention synergistically implement dielectric material with a Young modulus of less than 5 GPa and a percent elongation of more than 3%. By taking this measure, significant vulnerabilities of conventionally used dielectric material in the semi-flexible portion of a semi-flex component carrier can be over-come. Based on simulations, the described solution has been identified which shows particularly advantageous properties when using low or even ultra-low Young modulus materials in combination with a specifically selected range of ductility. While conventional semi-flexible PCBs have been used for high bend radius applications only with an estimated radius of for example more than 5 mm up to 5 cycle bending requirement, exemplary embodiments of the invention may significantly lower the bend radius, for instance down to 2 mm, and/or may increase the bending endurance up to 100 cycles with larger bending condition (for instance larger than 5 mm).

In the following, further exemplary embodiments of the method and the component carrier will be explained.

In an embodiment, the at least one of the at least one electrically insulating layer structure forming at least part of the semi-flexible portion comprises or consists of a resin, in particular an epoxy resin. In particular, a proper selection of the base resin and/or one or more additives may allow to adjust the properties of said dielectric layer in terms of elasticity/Young modulus and ductility/elongation.

In an embodiment, the at least one of the at least one electrically insulating layer structure forming at least part of the semi-flexible portion comprises epoxy derivatives, in particular Ajinomoto Build-up Film®. Ajinomoto Build-Up Film is a registered trademark of Ajinomoto Co., Inc. of Tokyo, Japan. Such a material may be a suitable choice to provide the above-described properties in terms of low Young modulus and high elongation.

In an embodiment, the at least one of the at least one electrically insulating layer structure forming at least part of the semi-flexible portion is free of glass cloth. The omission of glass fibers, glass spheres or any other reinforcing particles in a resin matrix of the at least one electrically insulating layer structure with low Young modulus and high elongation may promote improved bendability in the semi-flexible portion in view of the obtainable high elasticity and high ductility.

In an embodiment, the at least one of the at least one electrically insulating layer structure forming at least part of the semi-flexible portion extends over the (in particular entire) at least one semi-flexible portion and over the (in particular entire) at least one rigid portion. In other words, said dielectric layer with low Young modulus and high elongation may be shared between the semi-flexible portion and the rigid portion(s) of the component carrier. Forming said dielectric layer with low Young modulus and high elongation over both the semi-flexible portion and the at least one rigid portion may prevent mechanical weak points at one or more material inter-faces between the semi-flexible portion and one or more rigid portions. Such material interfaces may result from different materials of the dielectric in said portions and can be avoided by extending at least one continuous homogeneous dielectric layer with low Young modulus and high elongation extending over the entire horizontal expansion of the component carrier. Such a homogeneous dielectric layer may also be advantageous to suppress CTE (coefficient of thermal expansion) mismatch.

In an embodiment, the at least one of the at least one electrically insulating layer structure forming at least part of the semi-flexible portion is the outermost electrically insulating layer structure of the stack. Simulations have shown that in particular the outermost dielectric layer of the semi-flex component carrier is prone to failure during bending and suffers from the largest mechanical load in the semi-flexible portion and at its interface(s) to the rigid portion(s) during bending. The outermost dielectric layer of the semi-flex component carrier may experience maximum stretching during bending, so that the formation of said dielectric layer with the low value of the Young modulus and the high value of the elongation is in particular advantageous to prevent cracks during bending.

Additionally or alternatively, a dielectric layer with low Young modulus and high elongation forming at least part of the semi-flexible portion may be located in an interior, in particular at a center, of the electrically insulating layer structures of the stack. While the vertical center of the semi-flexible portion is usually less prone to failure than the outermost portion, configuring a central dielectric layer of the semi-flexible portion from a material with low Young modulus and high elongation can nevertheless support bendability in designs in which the outermost dielectric layer should be made of another material (for instance should comprise glass cloth for stability reasons). Highly advantageously, more than one layer structure (at least in the semi-flexible portion) may be made of a material having a low Young modulus and high elongation. In particular the provision of both the outer-most as well as a central dielectric layer structure of a material having low Young modulus and high elongation may be highly advantageous.

In an embodiment, all of the layer structures of the semi-flexible portion also extend along the at least one rigid portion. Highly advantageously, both the electrically conductive layer structures (in particular made of copper) as well as the electrically insulating layer structures (for instance comprising prepreg, FR4 and/or a material with low Young modulus and high elongation) of the semi-flexible portion may also extend into the one or more connected rigid portions. This ensures a high homogeneity and a high mechanical robustness of the component carrier as a whole. In particular, all of the layer structures are made of the same material and/or have the same thickness in the semi-flexible portion and in the at least one rigid portion. By taking this measure, the homogeneity of the semi-flexible portion and the connected regions of the one or more rigid portions may be further enhanced.

In an embodiment, the component carrier has a semi-flexible portion between two opposing rigid portions. Alternatively, it is however also possible that the semi-flexible portion is connected at one side to a rigid portion, whereas its opposing other side is unconnected.

In an embodiment, the at least one semi-flexible portion has a smaller number of layer structures and/or has a smaller thickness than the at least one rigid portion. Correspondingly, a cavity may be formed above and/or below the semi-flexible portion corresponding to layer structures of the connected rigid portion which are lacking in the semi-flexible portion.

In an embodiment, the at least one of the at least one electrically insulating layer structure forming at least part of the semi-flexible portion comprises a polymer having a flexible segment between a reactive segment and a hard segment. In particular, the hard segment may have a high temperature resistance, the flexible segment may show low warpage and relaxation on internal stress, and/or the reactive segment may be configured for reacting with epoxy resin. Descriptively speaking, the hard segment may have a high temperature resistance. The reactive segment may be capable of reacting with epoxy resin, for instance by crosslinking and/or by the formation of chemical bonds. The flexible segment in between may function as a flexible binder showing a low warpage and promoting relaxation on internal stress. By using such a polymer for the at least one electrically insulating layer structure with low Young modulus and high elongation, the proper bendability and high mechanical stability of the component carrier may be further improved.

In an embodiment, at least one of the at least one electrically insulating layer structure forming at least part of the semi-flexible portion has a Young modulus of less than 2 GPa, in particular less than 1 GPa (in particular at a temperature of 300 K). By taking this measure, the elasticity of the semi-flexible portion may be further enhanced, and the risk of failure during bending may be further suppressed.

In an embodiment, at least one of the at least one electrically insulating layer structure forming at least part of the semi-flexible portion has an elongation of larger than 4%, in particular larger than 5%, more particularly larger than 10% (in particular at a temperature of 300 K). Such a material in the semi-flexible portion may further promote ductility of the dielectric material and may improve mechanical integrity of the component carrier, even in the presence of small bending angles.

Furthermore, said material preferably has an elongation of less than 20% (in particular at a temperature of 300 K) in order to prevent excessive flexibility or bendability of the rigid portion (into which said dielectric layer may extend). An excessive elongation might deteriorate the mechanical stability of the component carrier as a whole.

In an embodiment, at least one of the at least one electrically insulating layer structure forming at least part of the semi-flexible portion has a coefficient of thermal expansion of less than 150 ppm/K at a temperature of 300 K. At the same time, it may be advantageous if the thermal expansion is at least 30 ppm/K. By correspondingly configuring the material of said dielectric layer structure, thermal stress within the component carrier can be suppressed even in the presence of pronounced temperature cycles.

In an embodiment, the semi-flexible portion has a horizontal length of at least 1 mm. By fulfilling this design rule, bendability of the semi-flexible portion may be further increased while keeping the risk of crack formation or the like during bending small.

In an embodiment, at least one of the at least one electrically insulating layer structure forming at least part of the semi-flexible portion is bent about a bending angle in a range between 0° in 180°. For instance, bending may occur with a bending angle in a range between 60° and 160° without the risk of failure.

In an embodiment, said at least one electrically insulating layer structure with low Young modulus below 5 GPa and high elongation above 3% is laminated as part of a resin coated copper (RCC) foil to the rest of the stack. This lamination may be accomplished in particular both in the semi-flexible portion and in the at least one rigid portion. In the context of the present application, the term "RCC" may particularly denote a double layer (or multilayer) having a copper foil with a main surface on which a resin film is applied. Such a resin film of a separate RCC foil may be at least partially uncured or may be already fully cured before connection with the other layer structures of the stack so that the RCC foil can be laminated as a whole to a layer stack. This simplifies handling and thus simplifies the manufacturing process of the component carrier. As a result, the RCC foil and thus also said at least one electrically insulating layer structure with low Young modulus below 5 GPa and high elongation above 3% may extend in an entire horizontal plane of the component carrier to be manufactured, i.e. may be present both in the semi-flexible portion and in the at least one rigid portion. This results in a homogeneous material distribution over the entire component carrier and thus suppresses undesired CTE mismatch which may result from inhomogeneous material distribution over the component carrier.

In an embodiment, the component carrier comprises a stress propagation inhibiting barrier (in particular a plurality of stacked vias filled at least partially with electrically conductive material) in an interface region between the at least one rigid portion and the at least one semi-flexible portion and configured for inhibiting stress propagation between the at least one rigid portion and the at least one semi-flexible portion during bending. Descriptively speaking, the mentioned stress propagation inhibiting barrier may be arranged to traverse a stress propagation trajectory between the at least one rigid portion and the at least one semi-flexible portion (in particular from a bending point to an embedded component) and may thus function for preventing propagation of bending stress.

In an embodiment, a transition region between the at least one rigid portion and the at least one semi-flexible portion has at least one slanted sidewall. A slanted sidewall at a bending position has turned out to reduce stress propagation within the component carrier.

In an embodiment, at least one component may be embedded in the partially flexible and partially rigid component carrier, in particular in a rigid portion thereof. In another embodiment, at least one component may also be embedded in the semi-flexible portion of such a partially flexible and partially rigid component carrier. Additionally or alternatively, at least one component may be surface mounted on the partially flexible and partially rigid component carrier, in particular on a rigid portion thereof. It is also possible that at least one component is surface mounted on a semi-flexible portion of such a component carrier.

In an embodiment, the component carrier may comprise a mechanical buffer structure surrounding at least part of the (in particular embedded) component and having a lower value of the Young modulus than other electrically insulating material of the stack. In particular, the component may be embedded in a core of the at least one rigid portion, and at least one electrically insulating layer structure of the stack surrounding at least part of the component may have a lower Young modulus than electrically insulating material of the core. According to such an embodiment, a semi-flex component carrier is provided which comprises a mechanical buffer structure as dielectric material at least partly encapsulating a component embedded in the stack, in particular in the rigid portion. Said mechanical buffer structure may have a value of the Young modulus (i.e. a ratio between an expanding force and a spatial expansion) being smaller than that of at least part of surrounding electrically insulating material of the stack. Descriptively speaking, such a dielectric material partially or entirely surrounding a component embedded in a semi-flex component carrier has a higher elasticity than other dielectric material of the stack, for instance made of FR4 material. As a result, the semi-flex component carrier may be less prone to failure (in particular less prone to the formation of cracks or to breakage) in particular in a volume portion corresponding to the embedded component when the semi-flexible portion is bent. Hence, a component carrier configured as a complete package provided in embedding technology may be combined with semi-flex technology. By taking these measures, a semi-flexible (in particular non-polyimide) based component carrier with embedded component and with semi-flex characteristics may be configured to be robust against bending stress.

In an embodiment, the mechanical buffer structure comprises a material having an elongation of larger than 3%, in particular larger than 5%, and a Young modulus of less than 5 GPa, in particular less than 1 GPa. Descriptively speaking, such a dielectric material of the mechanical buffer structure may have a higher elasticity and may be more ductile than conventional FR4 material. As a result, the embedded component may be less prone to failure (in particular less prone to the formation of cracks or to breakage) when the semi-flexible portion is bent.

In an embodiment, a vertical extension range of the component does not encompass a vertical level of at least one bending point between the at least one rigid portion and the at least one semi-flexible portion. By arranging the embedded component at a vertical height different from a vertical position of a bending between the semi-flexible portion and the rigid portion, the robustness of the embedded component encapsulated in the mechanical buffer structure can be further increased.

The one or more components can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guide, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. One or more components may be surface mounted on the component carrier and/or may be embedded in an interior thereof. Moreover, also other than the mentioned components may be used as component.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, dielectric material of at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, epoxy-based Build-Up Film, polytetrafluoroethylene (Teflon®), a ceramic, and a metal oxide. Teflon is a registered trademark of The Chemours Company FC LLC of Wilmington, Del. U.S.A. Reinforcing materials such as webs, fibers or spheres, for example made of glass (multi-layer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, electrically conductive material of the at least one electrically conductive layer structure comprises at least one of the group consisting of copper, aluminum, nickel, silver, gold, palladium, and tungsten. Although copper is usually preferred, other materials or coated versions thereof are possible as well, in particular coated with a supra-conductive material such as graphene.

In an embodiment, the component carrier is a laminate-type body. In such an embodiment, the semifinished product or the component carrier is a compound of multiple layer structures which are stacked and connected together by applying a pressing force, if desired accompanied by heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are OSP (Organic Solderability Preservative), Electroless Nickel Immersion Gold (ENIG), gold (in particular Hard Gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
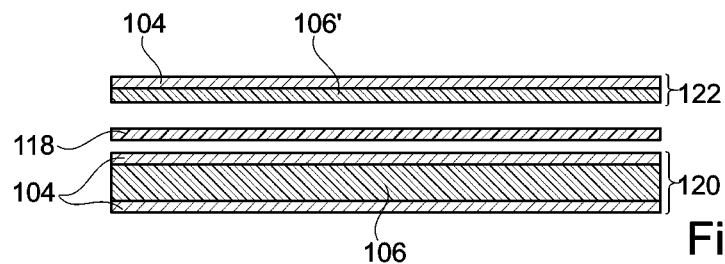
FIG. 1, FIG. 2, FIG. 3, FIG. 4 and FIG. 5 illustrate cross-sectional views of structures obtained during manufacturing a component carrier according to an exemplary embodiment of the invention.

The illustrations in the drawings are schematic. In different drawings, similar or identical elements are provided with the same reference signs.

Before, referring to the drawings, exemplary embodiments will be described in further detail, some basic considerations will be summarized based on which exemplary embodiments of the invention have been developed.

Conventionally, standard PCB materials are applied on a bend area of a semi-flex component carrier to allow usage of standard HDI (high density interconnect) and/or mSAP (modified semi-additive processing) PCB design rules. In an alternative conventional approach, a highly flexible material such as polyimide is applied in rigid-flex technology, which however involves significant limitations due to the use of the polyimide material.

According to an exemplary embodiment of the invention, it is possible to apply a dielectric low modulus and high elongation material to a semi-flexible portion of a semi-flex component carrier (in particular printed circuit board, PCB). This may allow to resolve a small bending radius and enable a dynamic bending angle on a semi-flex component carrier. In particular, this may be achieved by configuring a dielectric material at least in the semi-flexible portion to have a low Young modulus below 5 GPa and high elongation above 3%. Consequently, the dielectric material in the semi-flexible portion may be both elastic and ductile.

According to an exemplary embodiment of the invention, a semi-flexible PCB is provided with a semi-flexible portion having a dielectric material with low Young modulus below 5 GPa and high elongation above 3%. Conventionally, PCBs have been used for high bend radius applications only with estimated radius above 5 mm up to 5 cycle bending requirement. In contrast to this, according to an exemplary embodiment of the invention, it is possible to lower the bend radius down to 2 mm or less and/or to increase the bending endurance up to 100 cycles with bending condition of more than 5 mm.

Such a dielectric material at least in the semi-flexible portion may have an ultra-low Young modulus below 5 GPa (preferably below 1 GPa) and high elongation above 3% (preferably above 4%). To produce the ultra-low modulus materials in terms of a PCB manufacturing process, it has turned out advantageous to specifically adjust a hot press lamination process.

In particular, the material selection and manufacturing process of exemplary embodiments of the invention can be applied in particular to component carriers with 1 to 10, in particular 4 to 10, bending layers so that at least one of the bending layers is prepreg with glass reinforcement. Preferably, at least the outermost layer (considering the bend direction) can be made of an RCC (resin coated copper) material with low Young modulus below 5 GPa and high elongation above 3%. By taking this measure, it may be possible to improve the bending performance in terms on small-flex width, high bending angle and increased maximum number of bending times of a semi-flex component carrier. As a result, it may be possible to achieve a reliable bending capability of a semi-flex component carrier. In particular, it may be possible to introduce such a low modulus material into semi-flex PCB technology, and to reduce the manufacturing effort over conventional rigid-flex PCB technology. Synergistically, exemplary embodiments of the invention may promote electrical and mechanical miniaturization. Furthermore, exemplary embodiments of the invention may extend bending to install semi-flex application and are properly compatible with mass production on an industrial scale.

In terms of said dielectric material's Young modulus, at least one electrically insulating layer extending into a semi-flexible portion may be made of low modulus dielectric material below 5 GPa, in particular below 2 GPa.

What concerns material elongation, the at least one electrically insulating layer structure extending into the semi-flexible portion may be made of ultra-high elongation dielectric material about 3%, in particular by 5%, preferably above 10%.

Said material's coefficient of thermal expansion (CTE) is preferably below 150 ppm/K at room temperature. The CTE value is however preferably larger than 30 ppm/K.

In terms of flex area configuration, said low Young modulus (below 5 GPa) and high elongation (above 3%) material can, for example, have either of the following configurations:

a. said layer may be arranged on the outer layer of the stack in the semi-flexible portion b. said layer may be arranged in the center of the stack in the semi-flexible portion In particular, the semi-flexible portion can have a layer count in a range between 1 and 8 layers, in particular between 4 and 8 layers.

What concerns the mechanical bend design, it is preferred that the flex area length is longer than 1 mm. The bend angle can be, for instance, in a range between 0° and 180°.

Highly advantageously, the described architecture, both in the rigid portion and the semi-flexible portion, is compatible with the embedding of components, in particular large die embedding.

Exemplary embodiments of the invention may be implemented in all semi-flex component carriers and can be used to overcome conventional shortcomings of rigid-flex technology.

Figure 3:
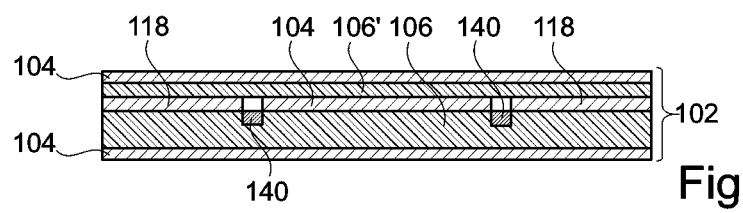
Figure 4:
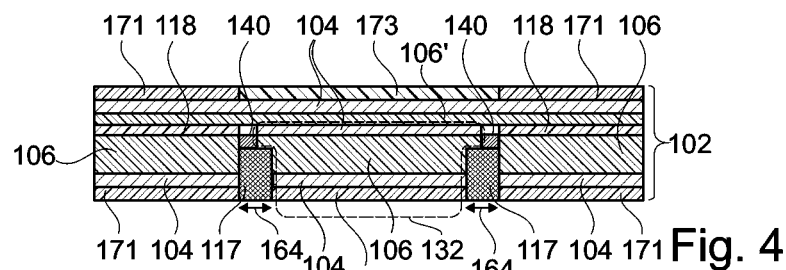
Figure 5:
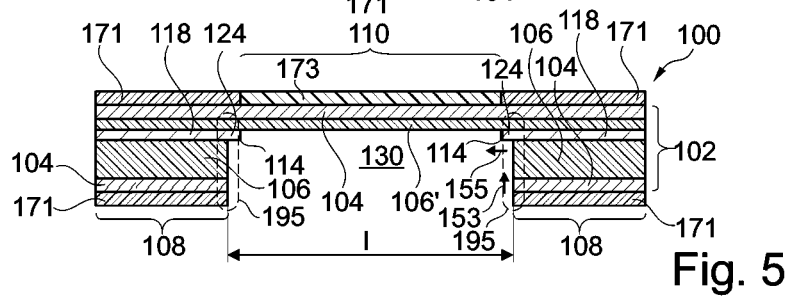

FIG. 1 to FIG. 5 illustrate cross-sectional views of structures obtained during manufacturing a semi-flex component carrier 100, shown in FIG. 5, according to an exemplary embodiment of the invention.

Referring to FIG. 1, base materials for the manufacturing process are shown. In particular, a low-flow or no-flow uncured layer structure 118 is sandwiched between a first multilayer structure 120 and a second multilayer structure 122.

Uncured layer structure 118 has not yet been fully cured by cross-linking its resin material by the application of pressure and/or heat. Thus, applying pressure and/or heat may re-melt the not yet cured resin material of the uncured layer structure 118 which is therefore capable of providing an adhesion function with connected layer structures upon triggering the curing process. For instance, the uncured layer structure 118 may be made of a low-flow or no-flow prepreg (i.e. resin, such as epoxy resin, comprising reinforcing particles, such as glass fibers). Such a low-flow or no-flow prepreg has the property that it will only flow to a very limited extent, if at all, into adjacent gaps during curing (which may be triggered by pressure and/or heating). Also, liquid dielectrics may be used.

The first multilayer structure 120 may be a fully cured core, for instance consisting of FR4 material as electrically insulating layer structure 106 covered on both opposing main surfaces thereof with a respective copper foil as electrically conductive layer structure 104.

The second multilayer structure 122 may, for example, be a resin coated copper (RCC) foil. For example, the second multilayer structure 122 may be composed of an electrically conductive layer structure 104 (for instance a copper foil) and an electrically insulating layer structure 106' on the electrically conductive layer structure 104 and formed on the basis of an ultra-low Young modulus material with a high elongation. More precisely, the value of the Young modulus of electrically insulating layer structure 106' may be less than 5 GPa, and preferably less than 1 GPa. In other words, the material of electrically insulating layer structure 106' may be highly elastic. Furthermore, the material of the electrically insulating layer structure 106' may have a high elongation of at least 3%, preferably at least 4%. As a result, the electrically insulating layer structure 106' may be highly ductile. To further promote bendability of electrically insulating layer structure 106', it may be free of glass cloth or other reinforcing particles. Thus, highly advantageously, the uppermost electrically insulating layer structure 106' may comprise a material having an elongation of larger than 4% and a Young modulus of less than 1 GPa. For instance, said electrically insulating layer structure 106' comprises epoxy derivatives, in particular Ajinomoto Build-up Film® or specifically configured epoxy resin. Preferably, said electrically insulating layer structure 106' is free of glass cloth, for instance consists of resin only. The material of said electrically insulating layer structure 106' may have a coefficient of thermal expansion of at least 30 ppm/K, but less than 150 ppm/K. All mentioned parameters refer to a temperature of 300 K. The electrically insulating layer structure 106' may be fully cured to simplify cavity formation (compare description of FIG. 4), but may also be at least partially uncured in another embodiment of the manufacturing method.

A thickness of the electrically insulating layer structure 106 of the first multilayer structure 120 may be larger than a thickness of the electrically insulating layer structure 106' of the second multilayer structure 122.

Figure 2:
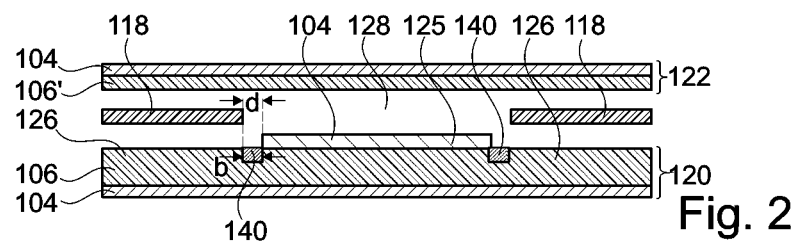

Referring to FIG. 2, preparation of the base materials shown in FIG. 1 before lay-up is illustrated.

As shown, the first multilayer structure 120 is provided with a stepped profile with a central protrusion 125 surrounded by a lateral base 126 and an indentation 140 in the base 126. This can be accomplished by patterning the upper electrically conductive layer structure 104 of the first multilayer structure 120. The indentation 140 may be formed as a groove or a channel in the electrically insulating layer structure 106 of the first multilayer structure 120 along a pre-determined transition line. The indentation 140 may be formed to laterally surround the protrusion 125 and will later serve for defining formation of a cavity 130. For forming the indentation 140, it is possible to remove the FR4 material of the electrically insulating layer structure 106 of the first multilayer structure 120 at one side except the region defined by the copper of protrusion 125 in the later bending area of the semi-flex component carrier 100 to be manufactured. Dielectric material may be mechanically, physically or chemically removed, copper may be etched. It is also possible to form the indentation 140 by carrying out a pre-deep milling procedure in the thick FR4 material of the electrically insulating layer structure 106 of the first multilayer structure 120.

Furthermore, the low-flow or no-flow uncured layer structure 118 is patterned to form a central recess 128 matching to the protrusion 125. The central recess 128 is positioned and dimensioned to accommodate the protrusion 125 and to be aligned with the indentation 140. Formation of the central recess 128 in the low-flow or no-flow uncured layer structure 118 may be accomplished, for example, by milling, punching or laser cutting the low-flow or no-flow uncured layer structure 118 selectively. Thus, the upper copper foil of the first multilayer structure 120 is patterned for forming the protrusion 125 providing a form closure with the recessed at least partially uncured low-flow or no-flow layer structure 118. The thickness of the upper electrically conductive layer structure 104 of the first multilayer structure 120 forming the protrusion 125 on the one hand and the thickness of the at least partially uncured low-flow or no-flow prepreg layer structure 118 may be the same or may be similar so as to obtain a vertical alignment.

The indentations 140 or slits serve for spatially delimiting the cavity 130 to be formed. Descriptively speaking, the indentations 140 support a milling tool 117 (see FIG. 4) to properly spatially define a semi-flexible portion 110 of the semi-flex component carrier 100 to be formed. As can be taken from FIG. 2, a gap "d" is defined between an interior side wall of the uncured low-flow or no-flow prepreg layer structure 118 and an adjacent side wall of the upper electrically conductive layer structure 104 of the first multilayer structure 120. Preferably, the dimension of gap "d" may be selected to be identical or substantially identical to a horizontal extension "b" of the indentation 140. More precisely, it should be mentioned that gap "d" denotes the corresponding dimension after connection of the shown layers (which means that, during cutting, the flow of material during lamination should be taken into account). More specifically, the exterior side wall of the indentation 140 may be in alignment with the interior side wall of the uncured low-flow or no-flow prepreg layer structure 118. Furthermore, the interior side wall of the indentation 140 may be in alignment with the sidewall of the upper electrically conductive layer structure 104 of the first fully cured multilayer structure 120.

Referring to FIG. 3, an interconnected stack 102 is formed by connecting the low-flow or no-flow uncured layer structure 118 between the first multilayer structure 120 and the second multilayer structure 122 by lamination, i.e. the application of pressure and/or heat. As a result, the electrically insulating uncured material of the low-flow or no-flow uncured layer structure 118 may re-melt, carry out cross-linking and may subsequently re-solidify. As a result, an adhesion force is created exclusively at the direct interfaces between layer structure 118 and the directly connected layer structures 120, 122. Since layer structure 118 is made of low-flow or no-flow material, this material will not flow or will not flow significantly into indentation 140, thereby advantageously keeping indentation 140 open and thereby simplifying the formation of the cavity 130 in a later process. For ensuring that material of layer structure 118 does not completely fill indentation 140 during lamination, the recess 128 formed in layer structure 118 according to FIG. 2 may be made sufficiently large.

As can be taken from the cross-sectional view of FIG. 3, the recessed uncured electrically insulating layer structure 118 is configured so that prepreg material is safely prevented from flowing into the indentations 140 during lamination. The distance or gap "d" may be maintained unfilled with the previously uncured (low-flow or) no-flow prepreg layer structure 118 being cured during lamination, since in particular no-flow prepreg has the property of performing substantially no-flow during curing. However, the distance or gap "d" may be alternatively partially or entirely filled with the previously uncured low-flow (or no-flow) prepreg layer structure 118 being cured during lamination, since in particular low-flow prepreg has the property of performing a certain (however relatively small) flow during curing.

Referring to FIG. 4, material is removed to thereby form a cavity 130 in the stack 102 to delimit a semi-flexible portion 110 defined by the cavity 130 from two opposing rigid portions 108 (compare FIG. 5). The semi-flexible portion 110 corresponds to the portion of the cavity 130, whereas the rigid portions 108 correspond to thicker portions of the laminated stack 102 around the cavity 130. Forming the cavity 130 may be accomplished by removing material of the stack 102 by milling using a milling tool 117 (indicated schematically in FIG. 4). During the milling, the lateral position of the milling tool 117 may be controlled so that steps (see reference numeral 114 in FIG. 5) are defined. The corresponding spatial adjustability of the position of the milling tool 117 is indicated by double arrows 164. Forming the cavity 130 may hence be accomplished by removing material substantially laterally inside of the indentation 140 by cutting the stack 102, from a bottom side thereof, substantially around the indentation 140. Thereafter, a non-adhering piece 132 of material surrounded by a corresponding cutting line may be simply taken out of the stack 102, thereby obtaining the cavity 130. The piece 132 does not adhere circumferentially, since it is circumferentially separated from the rest of the layer structures shown in FIG. 3 by milling. Furthermore, the piece 132 does not adhere at its top surface which corresponds to the upper main surface of the protrusion 125, since it does not comprise material of the (meanwhile cured) layer structure 118. Since the upper surface of the separation area delimiting the piece 132 is formed by the interface between the upper electrically conductive layer structure 104 of the former first multilayer structure 120 and the electrically insulating layer structure 106' of the former second multilayer structure 122, the lamination has not caused an adhesion there.

As further shown in FIG. 4, a finishing procedure may be carried out by depositing a first solder mask 171 on a portion of exposed electrically conductive surfaces of the obtained layer structure in the rigid portions 108, while a second solder mask 173 may be formed on an upper portion of exposed electrically conductive surfaces of the obtained layer structure in the bending portion or semi-flexible portion 110.

After having taken out the piece 132 and after formation of the solder masks 171, 173, the semi-flex component carrier 100 shown in FIG. 5 is obtained.

Referring to FIG. 5, the PCB manufacturing process may be finished by defining circumferential step 114 by correspondingly positioning the milling tool 117 for removing material of the stack 102 for forming the cavity 130 and by taking out the correspondingly formed piece 132. The step 114 is formed in a transition portion between the rigid portion 108 and the semi-flexible portion 110 in a corner of the cavity 130. A slight flow of low-flow prepreg or no flow prepreg may occur. As a result, the semi-flex component carrier 100 shown in FIG. 5 is obtained.

The semi-flex component carrier 100 is here embodied as a printed circuit board (PCB) and comprises laminated stack 102 composed of electrically conductive layer structures 104 and electrically insulating layer structures 106, 106'. For example, the electrically conductive layer structures 104 may comprise patterned copper foils and vertical through connections, for example copper filled laser vias. The electrically insulating layer structure 106 may comprise a resin (such as epoxy resin) and reinforcing particles therein (for instance glass fibers or glass spheres). For instance, the electrically insulating layer structure 106 may be made of prepreg or FR4. Electrically insulating layer structure 106' may be an epoxy resin layer without glass fibers and with lower Young modulus and higher elongation than the material of electrically insulating layer structure 106. The layer structures 104, 106, 106' may be connected by lamination, i.e. the application of pressure and/or heat.

As shown, said electrically insulating layer structure 106' with low Young modulus and high elongation extents over the entire semi-flexible portion 110 and the entire at least one rigid portion 108. Said electrically insulating layer structure 106' is the outermost electrically insulating layer structure of the laminated stack 102. The outermost electrically insulating layer structure 106' is particularly prone to crack formation during bending. Thus, configuring said outermost layer structure 106' from a low Young modulus and high elongation material, elongation stress may be suppressed most efficiently. The semi-flexible portion 110 may have a horizontal length l of at least 1 mm, for instance 2 mm.

In particular in bending areas corresponding to interface regions 195 between the semi-flexible portion 110 and the rigid portions 108, the risk of crack formation during bending of the semi-flexible portion 110 is particularly pronounced. However, in view of the low Young modulus and high elongation of the soft and elastic, more ductile than brittle, electrically insulating layer structure 106', mechanical durability in particular in the interface regions 195 may be significantly improved.

The semi-flex component carrier 100 according to FIG. 5 comprises the exterior rigid portions 108, the central semi-flexible portion 110 and the cavity 130 delimiting the semi-flexible portion 110 from the rigid portions 108. In other words, the semi-flexible portion 110 is arranged between or is enclosed by different rigid portions 108. The step 114 in a transition portion between the rigid portions 108 and the semi-flexible portion 110 in corners of the cavity 130 improves the mechanical integrity. While the rigid portions 108 and the semi-flexible portion 110 comprise substantially the same materials, the rigid portion 108 is rendered rigid by providing it with a larger vertical thickness than the semi-flexible portion 110. The latter is rendered flexible in view of its small thickness and the material selection of electrically insulating layer structure 106'. As can be taken from FIG. 5 as well, the rigid portions 108 and the semi-flexible portion 110 share common continuous electrically insulating layer structure 106' which corresponds to the original electrically insulating layer structure 106' of the second multilayer structure 122.

As shown in FIG. 5, the cavity 130 has a rectangular cross-section with corners in which the step 114 is formed as a convex protrusion 124. More precisely, the step 114 is formed by the meanwhile cured low-flow prepreg layer structure 118 in the transition portion. The presence of the steps 114 has a highly positive impact on the mechanical integrity of the semi-flex component carrier 100 even in the presence of bending forces or other tension forces exerted to the semi-flex component carrier 100 during operation or handling. As can be taken from reference numerals 153, 155, an exerted force (see reference numeral 153) may be manipulated or redirected by the step 114 (see reference numeral 155). Whichever theoretical explanation may be given, it has turned out that the presence of the step 114 improves the mechanical integrity of the semi-flex component carrier 100.

In the corner region or transition region of the semi-flex component carrier 100, the exerted force may be maximum. However, the breakage force in the corner region may be smaller in the absence of the step 114. By the presence of the step 114, the force limit of failure can be increased.

Figure 6:
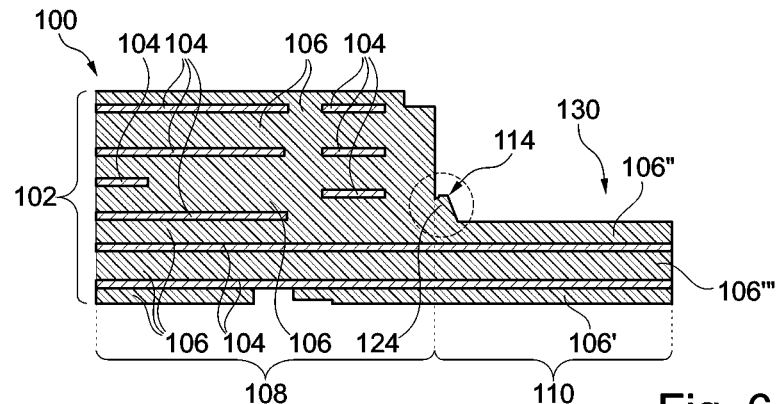
FIG. 6 illustrates a cross-sectional view of a component carrier according to another exemplary embodiment of the invention.

FIG. 6 is a cross-sectional view of a portion of a semi-flex component carrier 100 according to another exemplary embodiment of the invention.

According to FIG. 6, said electrically insulating layer structure 106' with low Young modulus and high elongation is the outermost electrically insulating layer structure 106 of the stack 102. Optionally, one or two further electrically insulating layer structure 106", 106''' in the semi-flexible portion 110 being located in an interior of the stack 102 may also be provided with low Young modulus of less than 5 GPa or even less than 1 GPa and high elongation of more than 3% or even more than 4%. This further improves the bendability characteristic of the component carrier 100.

Figure 7:
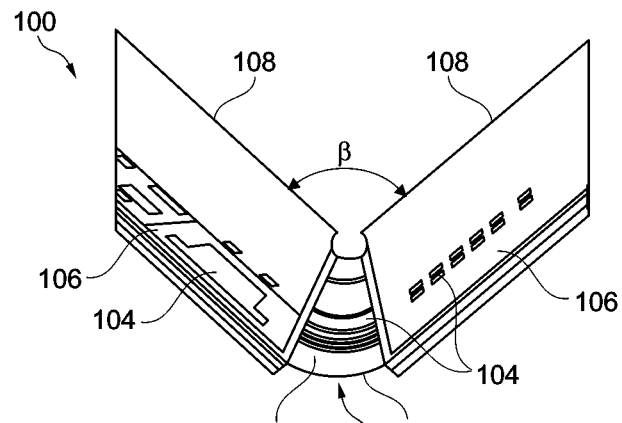
FIG. 7 illustrates a three-dimensional view of a component carrier according to still another exemplary embodiment of the invention.

FIG. 7 illustrates a three-dimensional view of a semi-flex component carrier 100 according to still another exemplary embodiment of the invention. Said electrically insulating layer structure 106' forming part of the semi-flexible portion 110 may be bent about a freely definable bending angle β in a range between 0° in 180°, in the present embodiment approximately 90°. Since the outermost portion 111 of the semi-flexible portion 110 is most prone to damage during bending, arranging the electrically insulating layer structure 106' with low Young modulus and high elongation at the side of said outermost portion 111 it is of utmost advantage.

Figure 8:
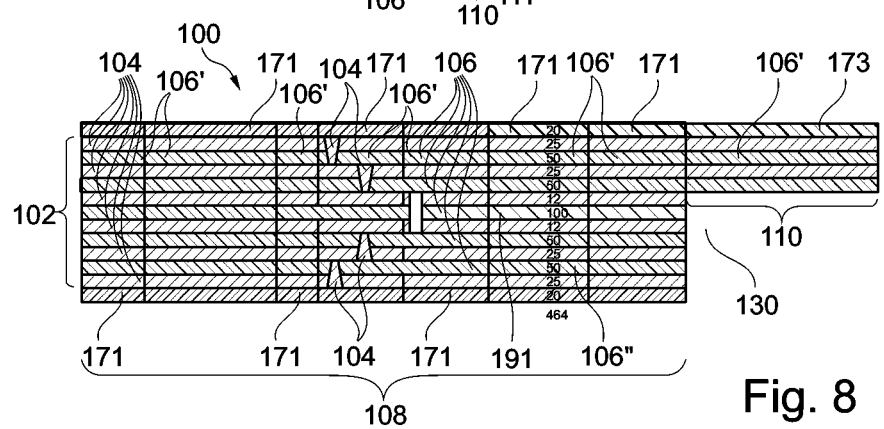
FIG. 8 illustrates a design of a component carrier according to a further exemplary embodiment of the invention.

FIG. 8 illustrates a design of a semi-flex component carrier 100 according to a further exemplary embodiment of the invention. The numbers in FIG. 8 illustrate the respective thickness of the respective layer structure in micrometers. As shown, all of the layer structures 104, 106, 106' of the semi-flexible portion 110 also extend along the at least one rigid portion 108. More specifically, all of the layer structures 104, 106 are made of the same material and have the same thickness in the semi-flexible portion 110 and in the at least one rigid portion 108.

As shown, the rigid portion 108 comprises an alternating sequence of six electrically conductive layer structures 104 and five electrically insulating layer structures 106. On top and on bottom of laminated stack 102, a respective solder resist 171, 173 is formed. While a standard solder mask may be used in the rigid portion 108 (compare reference numeral 171), a flexible solder mask ink may be implemented in the semi-flexible portion 110 (compare reference numeral 173). The uppermost electrically insulating layer structure 106' is configured as an epoxy-based material without glass cloth and having said low Young modulus and high elongation. Said electrically insulating layer structure 106' may be formed on the basis of an ultra-low modulus RCC (resin coated copper) foil. It is for instance also possible to configure the lowermost electrically insulating layer structure 106' in the rigid portion 108 as ultra-low modulus RCC-based layer. All other electrically insulating layer structures 106 may be made of prepreg comprising glass fibers or glass spheres as reinforcing particles. The thickest and most central electrically insulating layer structure 106 may be a core. The electrically conductive layer structures 104 are patterned or continuous copper layers (for instance formed by a combination of base copper and plated copper). In addition, vertical through connections (in particular copper filled laser vias) are provided forming part of the electrically conductive layer structures 104, but being located exclusively in the rigid portion 108.

Figure 9:
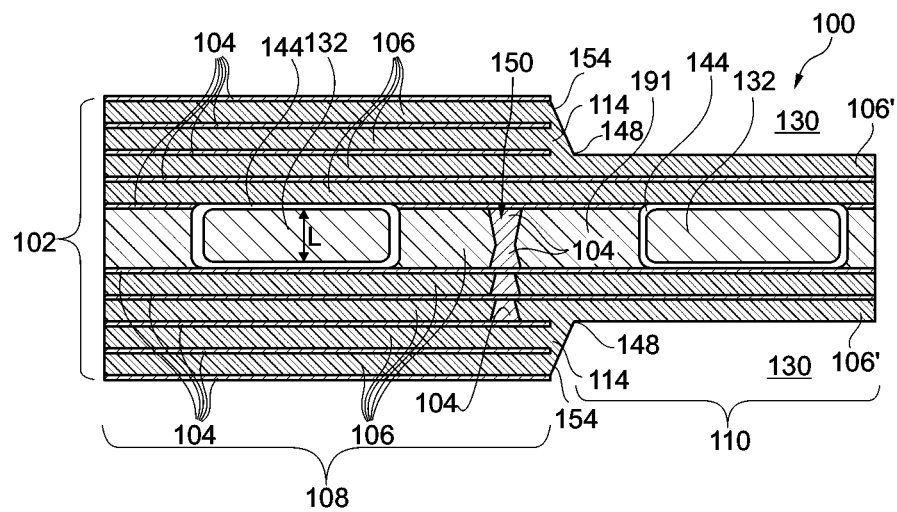
FIG. 9 illustrates a cross-sectional view of a component carrier according to still another exemplary embodiment of the invention.

FIG. 9 illustrates a cross-sectional view of a semi-flex component carrier 100 according to still another exemplary embodiment of the invention.

In the embodiment of FIG. 9, the semi-flexible portion 110 is formed as a central portion of the stack 102. The full thickness portion of the stack 102 constitutes the rigid portion 108. Material of the stack 102 is removed from both opposing main surfaces in the semi-flexible region 110 so that two cavities 130 at opposing main surfaces of the component carrier 100 are formed, thereby delimiting the semi-flexible portion 110.

Highly advantageously, it is possible to embed one or more components 132 (such as semiconductor chips) in the semi-flex component carrier 100. In the shown embodiment, one component 132 is embedded in a central core 191 of the rigid portion 108. Another component 132 is embedded in the central core 191 in the semi-flexible portion 110.

The component carrier 100 according to FIG. 9 also comprises a cage-shaped or shell-shaped locally elastic mechanical buffer structure 144 selectively surrounding the embedded components 132. The mechanical buffer structure 144 may be an epoxy resin layer without glass fibers and with lower Young modulus (for instance below 1 GPa) and higher elongation (for instance above 5%) than the material of the remaining electrically insulating layer structures 106, for instance with exception of electrically insulating layer structure 106' only. As shown, said mechanical buffer structures 144 with low Young modulus and high elongation surround substantially the entire embedded components 132 (for instance semiconductor chips), with the exception of contact vias (not shown) electrically contacting the component 132 with the electrically conductive layer structures 104 and/or an environment of the component carrier 100. More specifically, the mechanical buffer structure 144 covers horizontal surface portions as well as vertical sidewalls of the component 132. The mechanical buffer structure 144 is shaped as a shell surrounding substantially the entire component 132, with the only exception of said one or more vias (not shown) contacting one or more pads (not shown) on a horizontal main surface of the component 132. Said mechanical buffer structure 144 encapsulates component 132 which is particularly prone to crack formation during bending of the semi-flex component carrier 100. Thus, configuring said mechanical buffer structure 144 from a low Young modulus and high elongation material, elongation stress may be suppressed most efficiently. Descriptively speaking, an elastic and ductile encapsulation of the component 132 embedded in the rigid portion 108 may reliably protect the sensitive semiconductor component 132 against damage when bending the semi-flex component carrier 100 about bending point(s) 148. Apart from the selective individual change of the material composition directly around the component 132 by providing mechanical buffer structure 144, the rest of the stack 102 may be made of conventional and well available materials, with the exception of electrically insulating layer structure 106'.

As can be taken from FIG. 9 as well, a vertical extension range L of the components 132 does not encompass a vertical level of bending points 148 between the shown rigid portion 108 and the shown semi-flexible portion 110. Furthermore, a stress propagation inhibiting barrier 150 in form of a plurality of vertically stacked vias filled with electrically conductive material such as copper in an interface region between the illustrated rigid region 108 and the illustrated semi-flexible portion 110 inhibits stress propagation between the semi-flexible portion 110 and the rigid region 108 and up to the components 132 during bending. Said measures, i.e. a vertical displacement of the component 132 with respect to the bending points 148 and the provision of a stress propagation inhibiting structure 150, additionally contribute to the reliable protection of the embedded components 132 from damage during bending.

As shown in FIG. 9 as well, a transition region between the semi-flexible portion 110 and the rigid portion 108 has slanted sidewalls 154, both at the top side and on a bottom side. This further contributes to the protection of the component carrier 100 against damage during bending.

Figure 10:
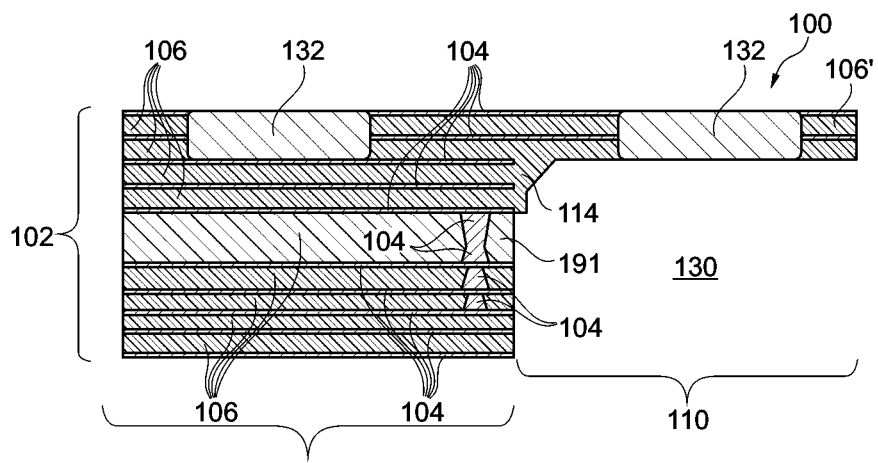
FIG. 10 illustrates a cross-sectional view of a component carrier according to yet another exemplary embodiment of the invention.

FIG. 10 illustrates a cross-sectional view of a semi-flex component carrier 100 according to yet another exemplary embodiment of the invention.

The semi-flex component 100 shown in FIG. 10 corresponds to the architecture described above referring to FIG. 6, but additionally has components 132 embedded in both the rigid portion 108 and the semi-flexible portion 110 which extend up to an upper main surface of the component carrier 100.

It has turned out surprisingly that the embedding of a respective component 132 in a semi-flexible region 110 comprising one or two electrically insulating layer structures 106' with low Young modulus and high elongation has no significant negative impact on the bendability and on the risk of crack formation in the semi-flexible portion 110.

Figure 11:
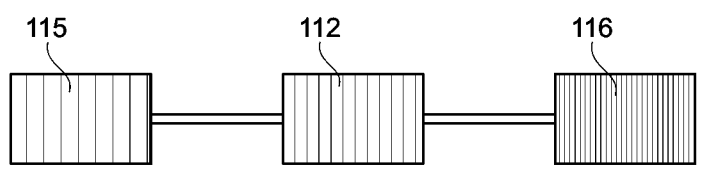
FIG. 11 illustrates a polymer with different functional sections used according to an exemplary embodiment of the invention.

FIG. 11 illustrates schematically a polymer with different functional sections 112, 115, 116 which may be used for forming the electrically insulating layer structure 106' according to an exemplary embodiment of the invention.

The illustrated polymer has a central flexible segment 112 between a reactive segment 115 on one side and a hard segment 116 on the opposing other side. The hard segment 116 may be configured to have a high temperature resistance. The flexible segment 112 promotes low warpage and serves for a relaxation on internal stress. The reactive segment 115 may be configured for reacting with epoxy resin to thereby form larger compounds.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principles according to the invention even in the case of fundamentally different embodiments.

The invention claimed is:

1. A semi-flex component carrier, comprising:
a stack, in particular a laminated stack, comprising at least one electrically insulating layer structure and at least one electrically conductive layer structure, wherein the stack defines at least one rigid portion and at least one semi-flexible portion; and
at least one step formed in the electrically insulating layer structure at an interface between the semi-flexible portion and the at least one rigid portion, wherein the electrically insulating layer structure comprises a first electrically insulating layer structure and a second electrically insulating layer structure, wherein, in a cross-section of the semi-flex component carrier, the second electrically insulating layer structure protrudes from the first electrically insulating layer structure to form the step;
wherein the at least one electrically insulating layer structure forms at least part of the semi-flexible portion and comprises a material having an elongation of larger than 3% and a Young modulus of less than 5 GPa.

2. The component carrier according to claim 1, wherein the at least one electrically insulating layer structure forming at least part of the semi-flexible portion comprises or consists of a resin, in particular an epoxy resin.

3. The component carrier according to claim 1, wherein the at least one electrically insulating layer structure forming at least part of the semi-flexible portion comprises epoxy derivatives.

4. The component carrier according to claim 1, wherein the at least one electrically insulating layer structure forming at least part of the semi-flexible portion is free of glass cloth, in particular is free of reinforcing particles embedded in a resin matrix.

5. The component carrier according to claim 1, wherein the at least one electrically insulating layer structure forming at least part of the semi-flexible portion extends over the at least one semi-flexible portion and over the at least one rigid portion.

6. The component carrier according to claim 1, wherein the at least one electrically insulating layer structure forming at least part of the semi-flexible portion and having an elongation of larger than 3% and a Young modulus of less than 5 GPa comprises an outermost electrically insulating layer structure of the stack.

7. The component carrier according to claim 1, wherein the at least one electrically insulating layer structure forming at least part of the semi-flexible portion and having an elongation of larger than 3% and a Young modulus of less than 5 GPa comprises an interior one, in particular a central one, of the electrically insulating layer structures of the stack.

8. The component carrier according to claim 1, wherein all of the layer structures of the semi-flexible portion also extend along the at least one rigid portion, wherein in particular all of said layer structures are made of the same material and/or have the same thickness in the semi-flexible portion and in the at least one rigid portion.

9. The component carrier according to claim 1, wherein the step is formed as a convex protrusion.

10. The component carrier according to claim 1, wherein the component carrier has the semi-flexible portion between two opposing rigid portions.

11. The component carrier according to claim 1, wherein the at least one semi-flexible portion has a smaller number of layer structures and/or has a smaller thickness than the at least one rigid portion.

12. The component carrier according to claim 1, wherein the at least one electrically insulating layer structure forming at least part of the semi-flexible portion comprises a polymer having a flexible segment between a reactive segment and a hard segment.

13. The component carrier according to claim 12, comprising at least one of the following features:
wherein the hard segment has a high temperature resistance;
wherein the flexible segment shows low warpage and relaxation on internal stress;
wherein the reactive segment is configured for reacting with epoxy resin.

14. The component carrier according to claim 1, wherein the at least one electrically insulating layer structure forming at least part of the semi-flexible portion has a Young modulus of less than 2 GPa, in particular less than 1 GPa.

15. The component carrier according to claim 1, wherein the at least one electrically insulating layer structure forming at least part of the semi-flexible portion has an elongation of larger than 4%, in particular larger than 5%, more particularly larger than 10%, and in particular smaller than 20%.

16. The component carrier according to claim 1, wherein the at least one electrically insulating layer structure forming at least part of the semi-flexible portion has a coefficient of thermal expansion of less than 150 ppm/K at a temperature of 300 K, and in particular has a coefficient of thermal expansion of at least 30 ppm/K at a temperature of 300 K.

17. The component carrier according to claim 1, wherein the flexible portion has a horizontal length of at least 1 mm.

18. The component carrier according to claim 1, wherein the semi-flexible portion is bent about a bending angle in a range between 0° in 180°.

19. The component carrier according to claim 1, further comprising:
a component embedded in the stack, in particular in a central core of the stack.

20. The component carrier according to claim 19, further comprising:
a mechanical buffer structure surrounding at least part of the component and having a lower value of the Young modulus than other electrically insulating material of the stack.

21. The component carrier according to claim 20, wherein the mechanical buffer structure comprises a material having an elongation of larger than 3%, in particular larger than 5%, and a Young modulus of less than 5 GPa, in particular less than 1 GPa.

22. The component carrier according to claim 1, wherein a vertical extension range of the component does not encompass a vertical level of at least one bending point between the at least one rigid portion and the at least one semi-flexible portion.

23. The component carrier according to claim 1, further comprising:
a stress propagation inhibiting barrier, in particular a plurality of stacked vias filled at least partially with electrically conductive material, in an interface region between the at least one rigid portion and the at least one semi-flexible portion and configured for inhibiting stress propagation between the at least one rigid portion and the at least one semi-flexible portion during bending.

24. The component carrier according to claim 1, wherein a transition region between the at least one rigid portion and the at least one semi-flexible portion has at least one slanted sidewall.

25. The component carrier according to claim 1, comprising at least one of the following features:
at least one component surface mounted on and/or embedded in the stack, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
wherein the at least one electrically conductive layer structure comprises at least one of the group consisting of copper, aluminum, nickel, silver, gold, palladium, and tungsten, any of the mentioned materials being optionally coated with supra-conductive material such as graphene;
wherein the at least one electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, epoxy-based Build-Up Film, polytetrafluoroethylene, a ceramic, and a metal oxide;
wherein the component carrier is shaped as a plate;
wherein the component carrier is configured as one of the group consisting of a printed circuit board, and a substrate;
wherein the component carrier is configured as a laminate-type component carrier.

26. A method of manufacturing a semi-flex component carrier, wherein the method comprises:
providing, in particular laminating, a stack comprising at least one electrically insulating layer structure and/or at least one electrically conductive layer structure, wherein the stack defines at least one rigid portion and at least one semi-flexible portion;
forming at least one step in the electrically insulating layer structure at an interface between the semi-flexible portion and the at least one rigid portion, wherein the electrically insulating layer structure comprises a first electrically insulating layer structure and a second electrically insulating layer structure, wherein, in a cross-section of the semi-flex component carrier, the second electrically insulating layer structure protrudes from the first electrically insulating layer structure to form the step; and
configuring the at least one electrically insulating layer structure forming at least part of the semi-flexible portion as a material having an elongation of larger than 3% and a Young modulus of less than 5 GPa.

27. The method according to claim 26, wherein said at least one electrically insulating layer structure is laminated as part of a resin coated copper foil to the stack, in particular both in the semi-flexible portion and in the at least one rigid portion.

28. The component carrier according to claim 1, wherein the at least one rigid portion and the semi-flexible portion share a common continuous electrically insulating layer structure which is a fully cured layer structure and arranged at that side of the second electrically insulating layer structure, which is opposed to the first electrically insulating layer structure.

29. The component carrier according to claim 28, wherein
in the cross-section of the semi-flex component carrier, the stack defines two rigid portions;
a cavity is formed above the semi-flexible portion corresponding to layer structures of the rigid portions which are lacking in the semi-flexible portion; and
the common continuous electrically insulating layer structure forms a bottom of the cavity.

* * * * *